(12) United States Patent
Shintani et al.

(10) Patent No.: US 6,218,031 B1
(45) Date of Patent: Apr. 17, 2001

(54) METHOD OF FORMING AN ANTICORROSIVE FILM FOR CONTACTS FOR ELECTRONIC PARTS

(75) Inventors: Tadashi Shintani, Hachioji; Yasuhiro Yuzurihara, Oume, both of (JP)

(73) Assignee: Japan Aviation Electronics Industry, Ltd. (JP)

( * ) Notice: Subject to any disclaimer, the term of this patent is extended or adjusted under 35 U.S.C. 154(b) by 0 days.

(21) Appl. No.: 09/340,548

(22) Filed: Jun. 28, 1999

(30) Foreign Application Priority Data

Jun. 29, 1998 (JP) .................................. 10-183018

(51) Int. Cl.$^7$ ............................ B23B 15/01; C25D 11/00
(52) U.S. Cl. ........................................ 428/672; 205/317
(58) Field of Search ............................. 205/317; 428/672

(56) References Cited

U.S. PATENT DOCUMENTS

| | | | |
|---|---|---|---|
| 3,930,963 | * | 1/1976 | Polichette et al. .................. 205/125 |
| 4,338,997 | * | 7/1982 | Krueger et al. .................. 165/132 R |
| 4,503,131 | * | 3/1985 | Baudrand .......................... 428/672 |
| 4,560,445 | * | 12/1985 | Hoover et al. ...................... 205/125 |
| 4,698,162 | * | 10/1987 | Guilbault et al. ................... 210/710 |
| 5,750,271 | * | 5/1998 | Kuramoto et al. .................. 428/624 |
| 5,982,629 | * | 11/1999 | Shoji et al. ........................ 367/760 |

FOREIGN PATENT DOCUMENTS

2717062 * 2/1998 (JP) .
2717062   6/1998 (JP) .

* cited by examiner

*Primary Examiner*—Kathryn Gorgos
*Assistant Examiner*—Erica Smith-Hicks
(74) *Attorney, Agent, or Firm*—Laff, Whitesel & Saret, Ltd.; J. Warren Whitesel

(57) ABSTRACT

An anticorrosive film which can be formed without causing any substantial environmental pollution, can effectively prevent any corrosion from occurring through pinholes in a corrosive environment, allows the formation of a contact of high reliability maintaining a low contact resistance, and remains stable for a long time on the surface of a substrate having a gold or gold alloy layer without causing any variation in contact resistance, or undergoing any change in outward appearance. The film is formed by bringing the substrate surface into contact with an aqueous solution containing at least one of mercaptobenzothiazole and its derivatives as represented by the following formula at a concentration of 6 to 30 mmol/l.

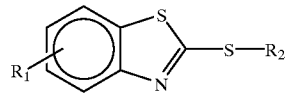

$R_1$: H or alkyl group
$R_2$: alkali metal or H

10 Claims, 2 Drawing Sheets

FORMATION OF A FILM FOR PROTECTION AGAINST CORROSION

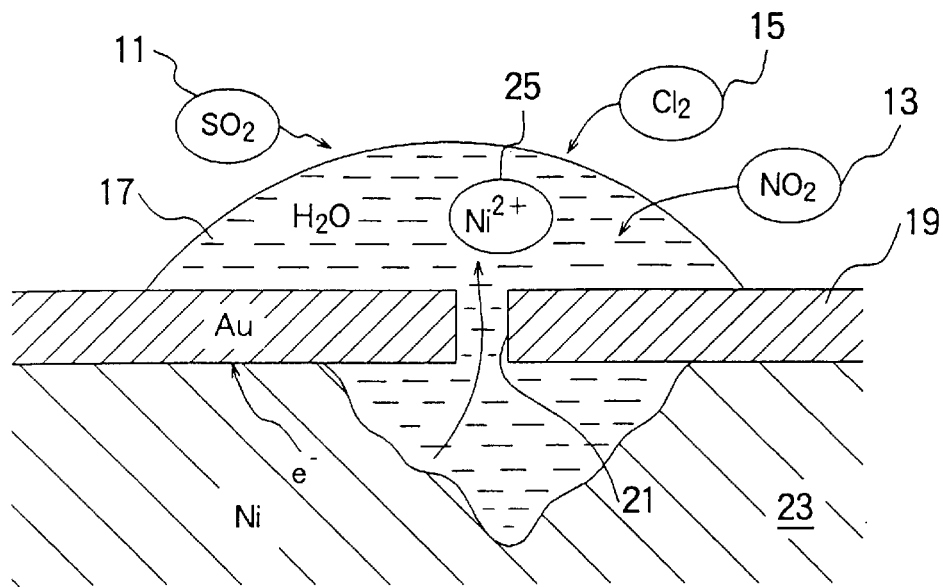
FIG. 1 MECHANISM OF CORROSION
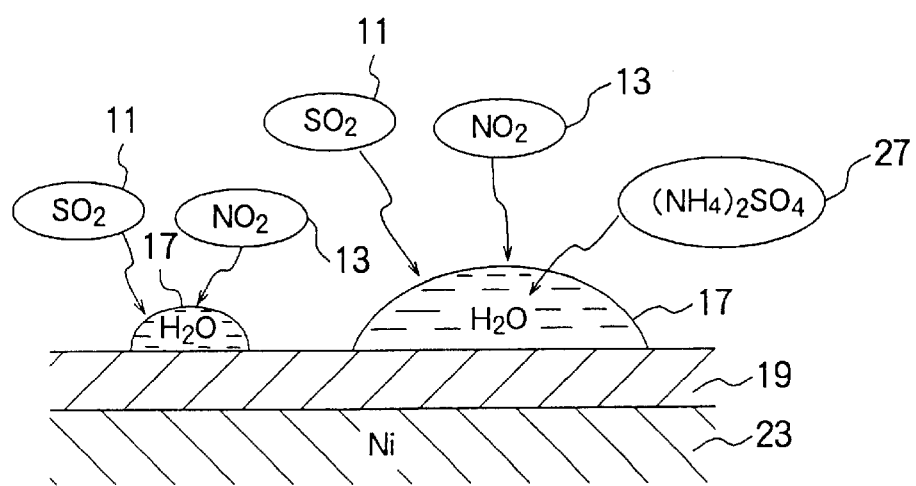
FIG. 2

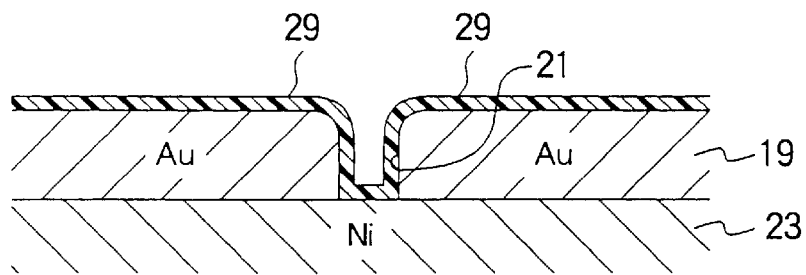
FIG. 3 FORMATION OF A FILM FOR PROTECTION AGAINST CORROSION

METHOD OF FORMING AN ANTICORROSIVE FILM FOR CONTACTS FOR ELECTRONIC PARTS

BACKGROUND OF THE INVENTION

1. Field of the Invention

This invention relates to a metal plated material having an anticorrosive film and to an aqueous solution for forming the same, and more particularly, to a metal plated material used for a conducting portion of an eletronic part, such as a connector, and an aqueous solution for forming the same.

2. Description of the Prior Art

Various kinds of connectors are used for making connections in an electronic device. The electronic parts, such as connectors, have contacts, and those contacts of which a particularly high level of reliability is required are formed by gold plating owing to the good conductivity and inertness of gold.

Gold is, however, expensive and adds to the cost of making a part or device. Therefore, the gold film is usually formed with a small thickness to enable a reduction of the cost. In accordance with decreasing a thickness, the film has a large number of pinholes. The pinholes are likely to cause the corrosion of the base metal which raises the contact resistance and lowers its reliability.

Various methods have, therefore, been taken to prevent corrosion through pinholes. They include the steps of forming a chromic acid film, dipping or immersing in a solution prepared by dissolving an organic compound having an adsorbing power in an organic solvent containing a halogen, and applying a lubricant oil to cover pinholes.

The chromic acid film has, however, been unsatisfactory in its action for preventing corrosion, since it is a film of an inorganic substance which is easily decomposed in a corrosive environment containing an acid gas. An increase of film thickness has been necessary to achieve an improved result, but has brought about a higher contact resistance and a lower reliability, as well as a problem of environmental pollution.

The problem of environmental pollution associated with solvent use is another disadvantage of prior art methods that employ an organic compound in an organic solvent for imparting anticorrosive properties.

On the other hand, the method has been carried out of applying a contact oil which consists of a lubricant oil by adding with an organic compound for preventing corrosion. It has been effective in a moist environment, but of low effect in a corrosive environment containing an acid gas. A number of reasons exist for which corrosion easily occurs. The compound is not effectively adsorbed to the surface to be protected. The molecules of corrosive gases and water are so small as to pass through an oil layer and reach the surface to be protected. Dust easily adheres to the oil layer and causes the gas and water molecules to be adsorbed to the surface to be protected.

Therefore, it has been necessary to find a method which can prevent corrosion as effectively as, or more effectively than the prior methods as described above without causing any environmental pollution, and without bringing about any appreciable increase in contact resistance. In this connection, there has been proposed a method which uses an aqueous solution of an organic compound having an anticorrosive action for application by dipping or electrolysis (Japanese Patent No. 2,717,062; hereinafter referred to as Prior Art 1).

According to the disclosure of Prior Art 1, an aqueous solution consisting mainly of a mercaptobenzothiazole derivative is electrolyzed by a direct current, while a gold plated material serves as the anode. The gold layer is formed on Nickel. The Nickel is electrolytically oxidized under the pinholes in the gold layer, and its reaction with the mercaptobenzothiazole derivative forms a complex compound which fills and seals the pinholes. The sealing of the pinholes is, however, insufficient for preventing any contact failure.

SUMMARY OF THE INVENTION

It is an object of this invention to provide an anticorrosive film which can be formed without causing any substantial environmental pollution.

It is another object of this invention to provide an anticorrosive film which can effectively prevent any corrosion from occurring through pinholes in a corrosive environment.

It is still another object of this invention to provide an anticorrosive film which allows the formation of a contact of high reliability maintaining a low contact resistance.

It is yet another object of this invention to provide an anticorrosive film which remains stable for a long time on the surface of a gold or gold alloy layer without causing any variation in contact resistance, or undergoing any change in outward appearance.

It is a further object of this invention to provide a method of forming an anticorrosive film as defined above.

It is a still further object of this invention to provide an aqueous solution which is used for forming an anticorrosive film as defined above.

According to this invention, there is provided a method of forming an anticorrosive film on the surface of a substrate having a metal film containing gold on its surface. In the method, the surface of the substrate is brought into contact with an aqueous solution containing at least one of mercaptobenzothiazole and their derivatives as represented by the following formula at a concentration of 6 to 30 mmol/l:

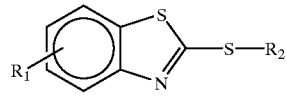

$R_1$: H or alkyl group
$R_2$: alkali metal or H

The aqueous solution preferably contains a borate as a buffer agent for controlling its pH.

The aqueous solution preferably has a pH of 9.0 to 11.0.

According to another preferred aspect of this invention, electrolysis is carried out by passing a direct current having a voltage of 0 to 1.0V through the aqueous solution as the electrolyte, while the metal film serves as the anode.

According to another aspect of this invention, there is provided an aqueous solution containing at least one of mercaptobenzothiazole and their derivatives as represented by the following formula at a concentration of 6 to 30 mmol/l, and used for forming an anticorrosive film on the surface of a substrate having a metal film containing gold on its surface:

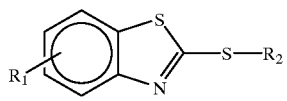

R₁: H or alkyl group
R₂: alkali metal or H

The aqueous solution preferably contains a borate as a buffer agent for controlling its pH.

The aqueous solution preferably has a pH of 9.0 to 11.0.

The aqueous solution is preferably used as the electrolyte for electrolysis conducted by passing a direct current having a voltage of 0 to 1.0V therethrough, while the metal film serves as the anode.

According to this invention, there is also provided a metal plated material comprising a substrate having a metal film containing gold on its surface, and an anticorrosive film formed on the substrate, the anticorrosive film being substantially a film formed on the surface of the metal film by electrolyzing a solution containing at least one of mercaptobenzothiazole and their derivatives as represented by the following formula, while the substrate serves as the anode:

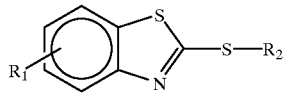

R₁: H or alkyl group
R₂: alkali metal or H

The metal plated material is preferably used as a contact for a connector. The contacts formed by the material of this invention have a long life owing to the improved resistance of the gold (or gold-alloy) layer to wear despite their frequent contact, since the anticorrosive film covers the whole surface of the gold layer, as opposed to the mere sealing of pinholes by Prior Art 1.

BRIEF DESCRIPTION OF THE DRAWINGS

FIG. 1 is a diagram for use in explaining the mechanism through which corrosion occurs to a gold plated contact for a connector;

FIG. 2 is a diagram for use in explaining the mechanism through which a contact failure occurs to a gold plated contact for a connector; and FIG. 3 is a fragmentary sectional view of an anticorrosive film formed on the surface of a gold plated contact for a connector in accordance with this invention.

DESCRIPTION OF THE PREFERRED EMBODIMENTS

Description will first be made as regards the principles of this invention with reference to FIGS. 1 to 3 prior to the description of specific examples embodying this invention.

Referring to FIG. 1, the mechanism is shown through which corrosion occurs to a contact for a connector. The contact which comprises a substrate 23 of nickel or copper, and a gold film 19 formed thereon from gold or a gold alloy by plating. Corrosive gases 11, 13 and 15 and water molecules 17 are adsorbed to the surface of the gold film 19 and form an electrolyte thereon. The electrolyte enters a pinhole 21 in the gold film 19 and forms a corrosion cell between the gold film 19 and the substrate 23. The base metal forming the substrate 23 is dissolved as nickel ions 25 (or copper ions) and forms a salt on the surface of the gold layer 19. Such corrosion through pinholes can be prevented by sealing the pinholes 21 as taught by Prior Art 1.

Description will be made as regards the source causing a failure of contact in a gold plated connector contact according to related Art 1. Gold (Au) is a metal having a catalytic action, though its action is not as high as that of platinum (Pt). When sulfurous anhydride ($SO_2$) 11, nitrogen dioxide ($NO_2$) 13 and water molecules ($H_2O$) 17 are present in the vicinity of a gold film 19, the gold in the gold film 19 acts as a catalyst for the reaction of those corrosive substances to form ammonium sulfate [$(NH_4)_2SO_4$] 27 on the surface of the gold film 19. This reaction product appears as a spot of discoloration and brings about an elevation of contact resistance and, thereby, a failure of contact. The formation of ammonium sulfate 27 cannot be prevented even if the pinholes in the gold film 19 may be sealed as taught by Prior Art 1.

According to this invention, however, the formation of ammonium sulfate, as well as corrosion through pinholes, can be prevented by forming a protective film for preventing the adsorption of corrosive gases ($SO_2$, $NO_2$ and $Cl_2$) 11, 13 and 15 and water 17 on the whole surface of the gold film 19 and in the pinholes 21.

Next, description will be made in regards to a surface of gold-plated material for connector contact and a mechanism of anticorrosion thereof according to the present invention with reference to FIG. 3.

Referring to FIG. 3, an anticorrosive film 29 is formed on a gold film 19 on a metal substrate 23. The film 29 preferably has a water-repelling surface. The film 29 is required to have a thickness not exceeding 10 nm to produce a tunnel effect to stabilize the contact resistance of the connector contact. The film 29 can effectively be formed from a substance having a strong force for combining with the gold in the gold layer 19 and the nickel or copper in the substrate 23 exposed through the pinholes 21.

After considering these factors, we, the inventors of this invention, have found it possible to form such a film by electrolyzing an aqueous solution containing mercaptobenzo-thiazole or a derivative thereof at a concentration of $6\times10^{-3}$ to $3\times10^{-2}$ mol/l by passing a direct current through it, while a gold plated product serves as the anode.

While Prior Art 1 employs a solution containing one or more mercaptobenzothiazole derivatives at a concentration of 10 to 1,000 ppm, this invention preferably employs a solution containing mercaptobenzothiazole or a derivative thereof at a concentration not lower than $6\times10^{-3}$ mol/l to form a dense film on the whole surface of a gold film, and not higher than $3\times10^{-2}$ mol/l to ensure the stability of the solution. For example, a sodium salt of mercaptobenzothiazole may be contained in a solution at a concentration of 1,135 to 5,677 ppm.

The solution preferably has a pH of 9.0 to 11.0 to ensure the rapid formation of a proper film. Its pH of at least 9.0 ensures the conversion of mercaptobenzothiazole or its derivative to a thiol type compound. Its pH not exceeding 11.0 ensures that no hydroxyl ion be adsorbed to the surface of the gold film and hinder mercaptobenzothiazole or its derivative from combining with gold.

The electrolysis is preferably carried out by applying a voltage of 0 to 1V between the electrodes, while using the gold film as the anode, so that mercaptobenzothiazole or its derivative may effectively combine with gold. The application of any voltage higher than 1V is undesirable, since an undesirable variation in contact resistance is likely to result from the deposition of dissolved nickel or copper on the surface of the gold film, or its combination with mercaptobenzothiazole or its derivative to form a salt protruding from any pinhole.

Moreover, the film 29 covering the whole surface of the gold film 19 prevents any $SO_2$ and $NO_2$ from contacting it and reacting to produce on it any ammonium sulfate that would bring about an elevation in contact resistance.

The invention will now be described in further detail based on specific examples embodying it.

EXAMPLE 1

Phosphor bronze for springs (C5210-H) is pressed in the form of a coupon having a thickness of 0.3 mm and wound in a reel. The coupon was plated in a reel-to-reel continuous electroplating line. After degreasing and pickling, it was plated with a nickel layer having a thickness of about 2 $\mu$m in a sulfamic acid bath, and a gold-cobalt alloy layer formed thereon and having a thickness of about 0.1 $\mu$m. Its treatment for protection against corrosion was thereafter given in the same line. Then, the coupon was cut to form contact samples. Each sample was tested for its contact resistance and for its corrosion resistance.

Its contact resistance was determined by pressing a gold plated probe of a Pt-Ir alloy under a load of 50 g at an open-circuit voltage of 20 mV at 10 mA. Its corrosion resistance was determined by conducting a sulfurous anhydride test ($SO_2$) in an acidic gas containing 10±3 ppm at 40±2° C. and a high humidity for 240 hours in accordance with JEIDA-39, and a salt spray test with a 5% NaCl solution at 350° C. for 48 hours in accordance with MIL-STD-202, Method 101, Condition B. The results are shown in Table 1.

TABLE 1

| | | Condition of Treatment | | Test Results | | |
|---|---|---|---|---|---|---|
| Sample No. | | Voltage Applied Between Electrodes | Duration of Treatment | Initial Contact Resistance | sulfurous anhydride Test | Salt Spray Test |
| Present Invention | 1 | 0.1 v | 30 s | ○ | ○ | ○ |
| | 2 | 0.5 v | 15 s | ○ | ○ | ○ |
| | 3 | 0.8 v | 5 s | ○ | ○ | ○ |
| Comparative Examples | 4 | chromic acid treatment | | Δ | Δ | ○ |
| | 5 | contact oil applying | | Δ | Δ | ○ |
| | 6 | contact oil applying | | Δ | Δ | ○ |
| | 7 | no treatment | | — | x | x |

Table 1 also shows the results of Comparative Samples Nos. 4 to 6. Sample No. 4 had a chromic acid film formed by electrolysis from a commercially available discoloration preventing agent containing chromic acid. Samples Nos. 5 and 6 were coated with a commercially available diester oil and a commercially available poly-α-olefin oil, respectively, by direct spraying.

The initial contact resistance was measured of each sample at 10 points, and compared with the results of a sample to which no treatment had been given. In Table 1, the results are shown by the symbol "○" meaning a difference not greater than 2 mΩ, "Δ," meaning a difference not greater than 4 mΩ, and "x" meaning a difference greater than 4 mΩ.

The results of the sulfurous anhydride and salt spray tests were obtained by examining the appearance of the sample through an optical microscope of 10 magnifications. In Table 1, the results are shown by the symbol "○" meaning the absence of any corrosion product, "Δ" meaning the presence of a small amount of a corrosion product, and "x" meaning the presence of a large amount of a corrosion product.

As is obvious from Table 1, Samples Nos. 1 to 3 embodying this invention were superior to the Comparative Samples in the results of the initial resistance and sulfurous anhydride tests, and comparable to them in the results of the salt spray tests.

What is claimed is:

1. A method of forming an anticorrosive film on the surface of a substrate having a metal film containing gold on its surface, the method comprising a step of bringing said substrate surface into contact with an aqueous solution containing at least one of mercaptobenzothiazole and its derivatives as represented by the following formula at a concentration of 6 to 30 mmol/l:

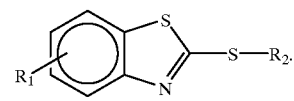

$R_1$: H or alkyl group
$R_2$: alkali metal or H

2. A method as set forth in claim 1, wherein said solution contains a borate as a buffer agent for controlling its pH.

3. A method as set forth in claim 1, wherein said solution has a pH of 9.0 to 11.0.

4. A method as set forth in claim 1, wherein direct-current electrolysis is carried out at a voltage of 0 to 1.0 V and said metal film as an anode by the use of said solution as the electrolyte.

5. An aqueous solution used for forming an anticorrosive film on the surface of a substrate having a metal film containing gold on its surface, the solution containing at least one of mercaptobenzothiazole and its derivatives as represented by the following formula at a concentration of 6 to 30 mmol/l:

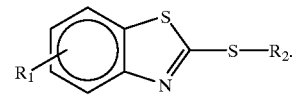

$R_1$: H or alkyl group
$R_2$: alkali metal or H

6. A solution as set forth in claim 5, further containing a borate as a buffer agent for controlling its pH.

7. A solution as set forth in claim 5, said solution having a pH of 9.0 to 11.0.

8. A solution as set forth in claim 5, said solution being used as the electrolyte for direct-current electrolysis, wherein said direct-current electrolysis is carried out at a voltage of 0 to 1.0 V by the use of said metal film as the anode.

9. A metal plated material comprising a substrate having a metal film containing gold on its surface, and an anticorrosive film formed on said substrate, wherein the anticorrosive film consists substantially of a film formed on the surface of said metal film by electrolyzing a solution containing at least one of mercaptobenzothiazole and their derivatives at a concentration of 6 to 3 mmol/l as represented by the following formula, while said substrate serves as the anode:

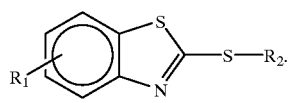
R₁: H or alkyl group
R₂: alkali metal or H
10. A metal plated material as set forth in claim 9, said metal plated material being used as a contact for a connector.